(12) United States Patent
Sato et al.

(10) Patent No.: US 6,600,166 B2
(45) Date of Patent: Jul. 29, 2003

(54) SCANNING EXPOSURE METHOD

(75) Inventors: Takashi Sato, Fujisawa (JP); Katsuhiko Hieda, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/910,919

(22) Filed: Jul. 24, 2001

(65) Prior Publication Data

US 2002/0014600 A1 Feb. 7, 2002

(30) Foreign Application Priority Data

Jul. 26, 2000 (JP) .................................... 2000-225736

(51) Int. Cl.$^7$ ............................................. G01N 21/86
(52) U.S. Cl. .................... 250/548; 250/559.06; 430/394
(58) Field of Search ........................... 250/548, 559.01, 250/234, 559.06; 430/22, 30, 5, 394; 355/53, 77, 55, 67, 71; 356/399, 401

(56) References Cited

U.S. PATENT DOCUMENTS 6,090,510 A * 7/2000 Tokuda ........................ 430/30
6,285,438 B1 * 9/2001 Hazelton et al. ............. 355/53
6,335,784 B2 * 1/2002 Mishima ...................... 355/53

FOREIGN PATENT DOCUMENTS

| JP | 4-10209 | 2/1992 |
| JP | 5-88531 | 12/1993 |
| JP | 6-53129 | 2/1994 |
| JP | 7-153658 | 6/1995 |
| JP | 11-214301 | 8/1999 |
| JP | 2000-133563 | 5/2000 |

\* cited by examiner

*Primary Examiner*—Kevin Pyo
*Assistant Examiner*—Seung C. Sohn
(74) *Attorney, Agent, or Firm*—Finnegan, Henderson, Farabow, Garrett & Dunner, L.L.P.

(57) ABSTRACT

Disclosed is a scanning exposure method, in which, when a pattern formed on a mask is transferred onto a wafer via an optical projection, the projecting region of the mask is limited by a slit, and the mask and the wafer are scanned in synchronism with the slit fixed so as to transfer the entire pattern region of the mask onto the wafer. In the scanning exposure method of the present invention, the exposure of the entire mask by the scanning of mask and the wafer is carried out twice by changing the exposure conditions. The first exposure and the second exposure are made opposite to each other in the scanning direction of the mask and the wafer so as to improve the pattern transfer accuracy.

17 Claims, 4 Drawing Sheets

| | Focus (μm) | Leveling (μm) | Exposure dose | Coherency factor σ | |
|---|---|---|---|---|---|
| 1st | −0.3 | 0 | 1 | 0.75 | (a) |
| 2nd | +0.3 | 0 | 1 | 0.75 | |
| 1st | 0 | ±0.3 | 1 | 0.75 | (b) |
| 2nd | 0 | 0 | 0.95 | 0.3 | |
| 1st | 0 | 0 | 1 | 0.7 | (c) |
| 2nd | −0.2 | 0 | 0.5 | 0.3 | |
| 1st | 0 | −0.3 | 1 | 0.75 | (d) |
| 2nd | 0 | +0.3 | 1 | 0.75 | |
| 1st | 0 | 0 | 0.95 | 0.3 | (e) |
| 2nd | 0 | +0.2 | 1 | 0.75 | |
| Range | −0.3〜+0.3 | −0.3〜+0.3 | 0.5〜+1 | 0.3〜0.75 | |

(NA=0.6)

SCANNING EXPOSURE METHOD

CROSS-REFERENCE TO RELATED APPLICATIONS

This application is based upon and claims the benefit of priority from the prior Japanese Patent Application No. 2000-225736, filed Jul. 26, 2000, the entire contents of which are incorporated herein by reference.

BACKGROUND OF THE INVENTION

1. Field of the Invention

The present invention relates to a scanning exposure method, in which the projection region of a mask is limited by a slit and the entire pattern region of the mask is transferred onto a substrate by scanning the slit relative to the mask and the substrate, particularly, to a scanning exposure method for multiple exposure of the pattern of the mask on the substrate.

2. Description of the Related Art

In recent years, a method of effectively increasing the depth of focus by applying a multiple exposure is proposed in the projection exposure technology for transferring the pattern on a mask onto, for example, a semiconductor substrate. For example, proposed in Japanese Patent Publication (Kokoku) No. 4-10209 is a multiple exposure in which a mask, an optical projection system, etc. are moved in the direction of optical axis during the exposure so as to suppress the fluctuation in the pattern size. On the other hand, Japanese Patent Publication (Kokoku) No. 5-88531 discloses the idea of effectively increasing the depth of focus of an optical exposure system by superposing a plurality of light beams having different imaging points on the same optical axis.

The conventional multiple exposure method pointed out above, which can certainly be applied to a step-and-repeat type exposure apparatus, cannot be applied as it is to a so-called "step-and-scan" type exposure apparatus, i.e., a scanning exposure apparatus in which the mask and the substrate are moved in parallel relative to the optical projection system.

In the scanning exposure apparatus, a mask is scanned in a one dimensional direction and, at the same time, a wafer is also scanned in a one dimensional direction in synchronism with the scanning of the mask. Under this condition, a slit-like exposure region is scanned on the mask surface so as to transfer the entire pattern region of the mask onto a transfer region. What should be noted is that the scanning exposure apparatus is constructed such that the mask and the wafer are moved relative to each other in a direction perpendicular to the optical axis of the optical projection system. Therefore, if the wafer and the optical projection system are moved in the direction of the optical axis relative to each other during the exposure, focused portions and portions that are not focused are present together depending on the positions of the transfer region. It follows that it is difficult to expect the effect of increasing the depth of focus. As a matter of fact, the resolution of the image is lowered.

Under the circumstances, a new method, which makes it possible to effectively apply a multiple exposure method to the scanning exposure apparatus, is proposed in Japanese Patent Disclosure (Kokai) No. 11-214301. In the new technology proposed in this prior art, the optimum imaging plane and the surface of the exposed region on the substrate are scanned as required in an inclined fashion with respect to a one dimensional scanning direction when the mask and the substrate are moved in parallel relative to the optical projection system so as to perform a multiple exposure method in which the depth of focus is seemingly increased. Also, it is possible to obtain a uniform effect of increasing the depth of focus in the longitudinal direction (non-scanning direction) of the slit region by simply controlling the leveling (inclined) state and the focusing state interlocked with the movement of the substrate in a one dimensional direction such that the relative inclination of the image plane within the slit region restricted within a circular imaging field of the optical projection system and the surface of the exposed region on the substrate is maintained within the range of the depth of focus of the optical projection system.

It is known to the art that it is difficult to set appropriately the exposure conditions in the multiple exposure method described above, though the multiple exposure method certainly produces a large effect in respect of the isolated pattern. It should be noted in this connection that, in the isolated pattern, the light intensity itself is markedly lowered with progress in the miniaturization of the pattern size and in the shift of focus so as to make the resolution difficult. To be more specific, the influence given by the reduction in the light intensity caused by the shift of focus is rendered prominent with reduction in the pattern size and in the image contrast so as to make it impossible to maintain a sufficient transfer accuracy.

A measure for overcoming the above-noted problem is disclosed in, for example, Japanese Patent Disclosure (Kokai) No. 7-153658. Specifically, it is disclosed that, in the process of performing a multiple exposure, the exposure is performed under the conditions which permit suppressing the reduction in the light intensity in the defocusing step and the exposure is performed under the conditions which permit ensuring a light intensity as high as possible in the center of the pattern in the focusing step so as to optimize the overall light intensity profile. The optimization can be achieved easily by changing the coherency factor $\sigma$ of the projection exposure apparatus.

The definition of the coherency factor $\sigma$ will now be described with reference to FIG. 1. The projection exposure apparatus shown in FIG. 1 comprises an illumination 1, a condenser lens 2, a photomask 3, a projection lens 4 and a silicon wafer 5. As shown in FIG. 1, the numerical aperture $NA_C$ of the condenser lens 2 and the numerical aperture $NA_p$ of the projection lens 4 are given as: $NA_C = \sin\theta_c$, $NA_p = \sin\sigma_p$. In this case, the coherency factor $\sigma$ of the projection exposure apparatus shown in FIG. 1 is given as: $\sigma = NA_c / NA_p$.

To be more specific, the measure proposed in Japanese Patent Disclosure (Kokai) No. 7-153658 is directed to the projection exposure of a pattern of a photomask on a substrate by using a projection exposure apparatus. It is proposed that at least three imaging points are set within a predetermined range, which includes a focusing point, along the optical axis of the projection exposure apparatus relative to the same position on the substrate, and the pattern is projected under the condition that the coherency factor $\sigma$ is lowered in the imaging point present in the focusing point and/or in the vicinity of the focusing point, compared with the coherency factor $\sigma$ in the other imaging points. Also, where three imaging points are set, it is optional whether each imaging point is set equal to one third of the conventional one exposure dose, whether the coherency factor $\sigma$ in the central imaging point is made larger than that of each of the $\sigma$ edge imaging points, and whether the coherency factor $\sigma$ in the central imaging point is made smaller than that of each of the edge imaging points. In any case, in order to obtain the optimum exposure conditions in the multiple exposure method, it is necessary to change the coherency factor σ of the illumination system for every exposure at different focuses. It is also necessary to control the exposure dose.

However, if it is intended to perform the change and the control described above in a scanning exposure, it is impossible to achieve the change and the control by employing the multiple exposure method in the scanning exposure apparatus disclosed in Japanese Patent Disclosure (Kokai) No. 11-214301. To be more specific, in the scanning exposure apparatus disclosed in this prior art, the scanning is performed with the mask and the wafer kept inclined relative to each other during the exposure within the slit restricting the exposure region. In this case, the amount of illumination within the slit is uniform. The coherency factor of the illumination system is also constant. Under the circumstances, it was impossible to control the coherency factor and the exposure dose of the illumination system for every focusing point, though such a control is required for optimizing the multiple exposure.

As described above, it is possible to carry out the multiple exposure by inclining the slit in the conventional step-and-scan system. However, it was difficult to control the coherency factor and the exposure dose of the illumination system for every focusing point, though such a control is required for optimizing the multiple exposure.

BRIEF SUMMARY OF THE INVENTION

According to an aspect of the present invention, there is provided a scanning exposure method, in which, when a pattern formed on a mask is transferred onto a target substrate via an optical projection system, the projecting region of the mask is limited by a slit, and the slit is scanned relative to the mask and the target substrate so as to transfer the entire pattern region of the mask onto the substrate, wherein the exposure of the entire mask by the relative scanning of the slit is carried out at least twice by changing the exposure conditions so as to achieve a multiple exposure of the pattern image on the substrate in a superposed fashion, the focusing points in the multiple exposure are set in at least two ways, and at least one multiple exposure is carried out under the condition that the mask and the substrate are relatively tilted within the projecting region restricted by the slit.

DETAILED DESCRIPTION OF THE INVENTION

The present invention will now be described in detail with reference to the embodiments shown in the accompanying drawings.

First Embodiment

Figure 1:
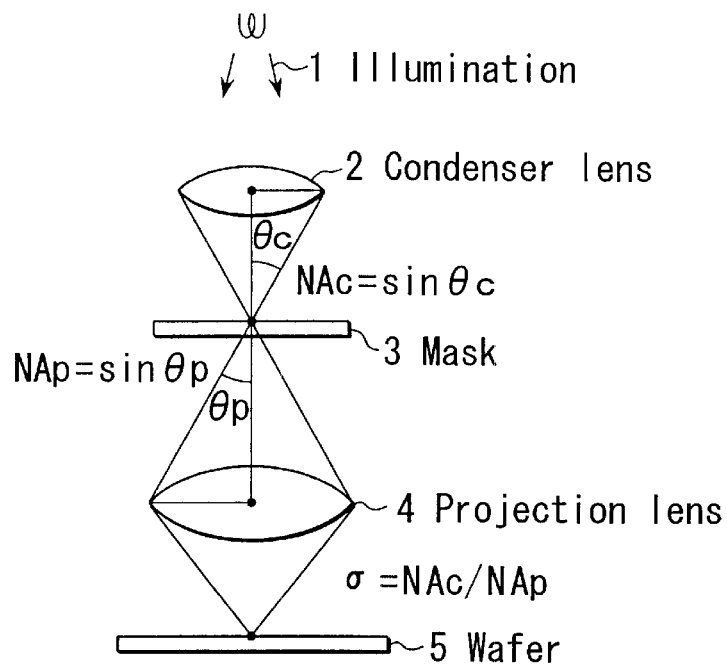
FIG. 1 schematically shows how to define the coherency factor.
Figure 2:
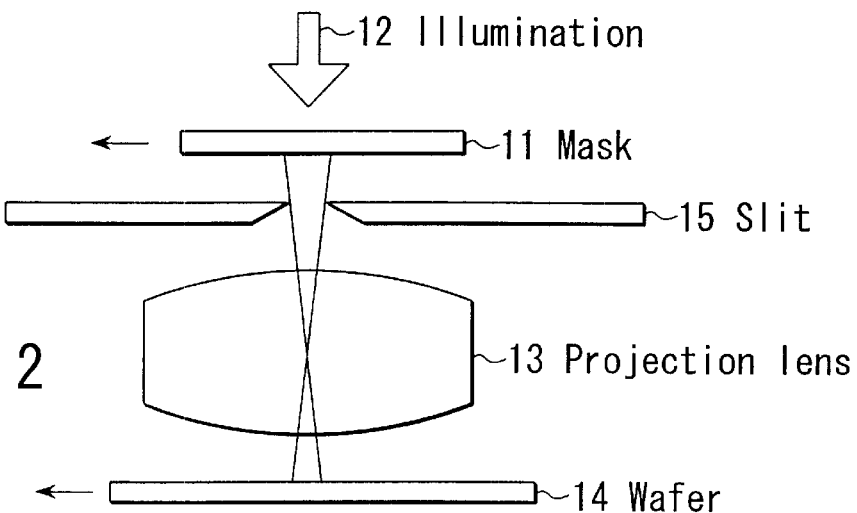
FIG. 2 shows the basic construction of a scanning exposure apparatus used in a first embodiment of the present invention.

FIG. 2 shows the basic construction of a step-and-scan type scanning exposure apparatus used in a first embodiment of the present invention.

A mask 11 having a desired LSI pattern formed therein is irradiated with an illumination light 12 so as to permit the mask 11 to be imaged on a wafer 14 by a projection lens 13. A slit 15 is arranged between the mask 11 and the lens 13. The projection region of the mask 11 is restricted by the presence of the slit 15, and the restricted projection region is exposed on the wafer 14. Since it is possible to move the projection region by moving the mask 11, it is possible to transfer the entire pattern region on the mask 11 onto the wafer 14 by moving the wafer 14 in synchronism with the movement of the mask 11.

Figure 3A:
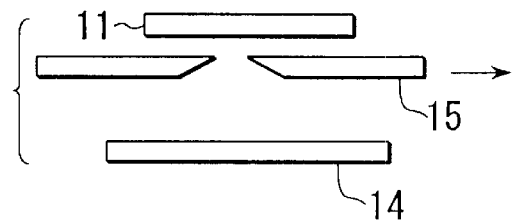
FIG. 3A shows the positional relationship among the mask, wafer and slit in the first embodiment of the present invention.
Figure 3B:
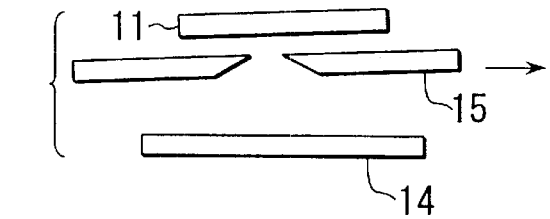
FIG. 3B shows the positional relationship among the mask, wafer and slit in the first embodiment of the present invention, in which the mask and the slit are tilted relative to the wafer.

It is possible to move the slit 15 as shown in FIG. 3A in place of moving the mask 11 and the wafer 14. In this case, it is necessary to move the projection lens 13 together with the slit 15. Also, as shown in FIG. 3B, it is also possible to move the slit 15 in the direction parallel to the surface of the wafer 14 in synchronism with the mask 11 and the wafer 14, with these mask 11 and wafer 14 held tilted.

Figure 4:
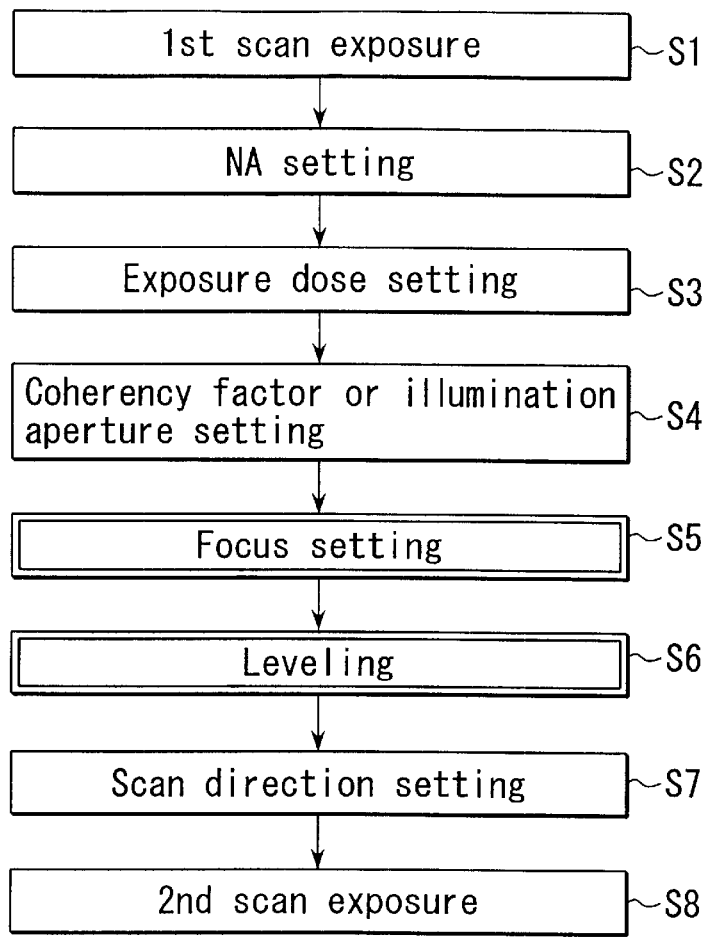
FIG. 4 is a flow chart showing the flow of the exposure process according to the first embodiment of the present invention.

FIG. 4 shows the exposure procedure according to the first embodiment of the present invention. In the first step, a first scanning exposure S1 is performed by scanning the slit 15 in one direction. As described previously, it is also possible to scan the mask 11 and the wafer 14 in synchronism in place of scanning the slit 15.

Then, a second scanning exposure S8 is performed by setting again some of the various exposure conditions set in the first scanning exposure S1. To be more specific, the second scanning exposure S8 is performed by setting again some of the exposure conditions set in the first scanning exposure including the setting S2 of the numerical aperture NA of the lens system, the exposure dose setting S3, the coherency factor or illumination aperture setting S4, the focus setting S5, the leveling S5 and the scan direction setting S7.

The illumination aperture setting represents in practice the operation to exchange the illumination aperture. Also, the leveling represents the scanning in parallel with the wafer 14 with the mask 11 and the wafer 14 held tilted, as already described with reference to FIG. 3B. Further, the scan direction setting represents the operation to determine whether the first scanning direction and the second scanning direction should be made equal or opposite to each other.

The first and second scanning directions are made opposite to each other in order to shorten the time required for exposure of a single exposure region. To be more specific, if the exposure is performed twice in the same scanning direction, it is necessary to perform the operation to bring the slit 15 back to the initial position of the exposure region without performing the exposure after the first exposure and, then, to perform the second exposure.

As described above, if the scanning directions in the exposure step are made opposite to each other, it is possible to allow the final position after the first exposure to be the initial position of the second exposure. Therefore, it is possible to eliminate the operation to bring the slit 15 back to the initial position in the first exposure without performing exposure, making it possible to markedly shorten the exposure time.

It should be noted that the value of at least one of the focus setting S5 and the leveling S6 of the mask to wafer used in the first scanning exposure should be different from that used in the second scanning exposure.

As described above, the set conditions for, particularly, the focus setting S5 and the leveling S6 are particularly important in the exposure procedure of the present invention shown in FIG. 4 and, thus, are surrounded by double lines. Also, it is possible to allow the coherency and exposure dose of the illumination for the first scanning exposure to be different from those in the second scanning exposure.

Second Embodiment

A second embodiment of the present invention will now be described with reference to FIGS. 5A and 5B. The following description of the second embodiment is directed to the case where the first and second scanning exposures differ from each other in the focusing point and are opposite to each other in the scanning direction.

To be more specific, the following results were obtained by using a scanning exposure apparatus (step-and-scan type exposure apparatus) in which a KrF excimer laser was used as a light source. The numerical aperture (NA) of the projection lens was 0.6, and the coherency factor σ of the illumination system was 0.75. By using the particular exposure apparatus, performed was a multiple focus exposure in which two different focusing points of −0.3 μm and +0.3 μm were focused. Concerning the pattern of the mask used, an open pattern having a width of 0.2 μm was formed on a positive tone resist.

For performing the exposure, a first scanning exposure is performed within the exposure region, with the focusing point set at −0.3 μm. After completion of the first exposure, a second scanning exposure is performed, with the focusing point set at +0.3 μm and with the end position of the first scanning exposure used as the starting point of the second scanning exposure, so as to carry out a multiple focus exposure. The scanning in the second scanning exposure was opposite to that in the first scanning exposure.

Figures 5A, 5B:
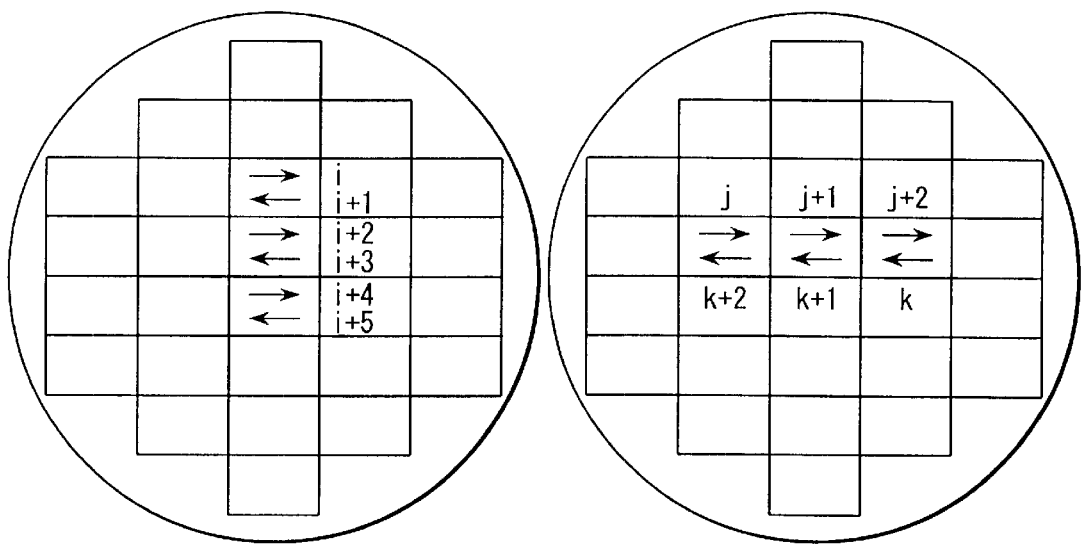
FIG. 5A shows an order of exposure of chip regions according to a second embodiment of the present invention.
FIG. 5B shows another order of exposure of chip regions according to the second embodiment of the present invention.

FIG. 5A shows the order of exposure within the wafer. To be more specific, after the i-th scanning exposure was performed by the first exposure process, the i+1st scanning exposure was applied by the second exposure process to the same exposure region, e.g., the same chip. The scanning direction for the i-th scanning exposure was opposite to that for the i+1st scanning exposure. Then, the i+2nd scanning exposure and the i+3rd scanning exposure were performed in the same exposure region, e.g., the chip region adjacent to the chip region noted above, in the opposite scanning directions. Further, the i+4th scanning exposure and the i+5th scanning exposure were performed in the same exposure region in the opposite scanning directions. The exposure described above was repeated so as to expose the entire wafer.

The multiple exposure method according to the second embodiment of the present invention was compared with the multiple exposure method in which the scanning direction in the second scanning exposure was made equal to that in the first scanning exposure in the required process time. It has been found that, where a single 8-inch wafer had 28 exposure regions, the embodiment of the present invention, in which the scanning direction in the second scanning exposure was made opposite, was found to permit shortening the process time by about 30%.

In this case, it is possible to perform the second scanning exposure for every exposure region as shown in FIG. 5A or to perform the second scanning exposure after the first exposure is finished in some exposure regions within the wafer as shown in FIG. 5B.

For example, in the exposure procedure shown in FIG. 5B, the exposure is continued such that, after the j-th scanning exposure, the j+1st scanning exposure is performed in a different exposure region and, then, the j+2nd scanning exposure is performed in another exposure region. After some exposure regions have been exposed, the k-th scanning exposure is applied as the second exposure to the region to which the j+2nd scanning exposure was applied previously in the scanning direction opposite to that in the first scanning exposure. Then, the k+1st scanning exposure is applied to the region to which j+2nd scanning exposure was applied previously in the scanning direction opposite to that for the first exposure. Further, the k+2nd scanning exposure is applied to the region to which j-th scanning exposure was applied previously in the scanning direction opposite to that for the first exposure. In this fashion, the entire wafer is exposed.

Alternatively, in the exposure within the wafer, it is possible for the case where the first scanning exposure and the second scanning exposure are equal to each other in the scanning direction to be present together with the case where the scanning directions in the first and second scanning exposures are opposite to each other depending on the arrangement of the exposure regions.

In the second embodiment of the present invention, it is possible to carry out the multiple exposure by making the first exposure and the second exposure different from each other in the focusing point. In this case, it is possible to set optionally the coherency factor and the exposure dose every time each of the first exposure and second exposure is carried out. It follows that it is possible to carry out the multiple exposure even in the step-and-scan system. In addition, it is possible to control the coherency factor of the illumination system and the exposure dose for each focusing point, which is required for the optimization of the multiple exposure, thereby contributing to an improvement in the pattern transfer accuracy. In addition, it is possible to shorten the time required for exposing a single exposure region by making the first scanning exposure and the second scanning exposure of the multiple exposure opposite to each other in the scanning direction.

It should also be noted that the technology of increasing the effective depth of focus by the multiple exposure as in the second embodiment of the present invention is effective even in the case where the pattern on the mask has a high density or is in the isolated state, and is also effective for a pattern such as a contact hole. Therefore, it is possible to improve the depth of focus even if different circuit patterns are present together on a mask.

Third Embodiment

Figure 6A:
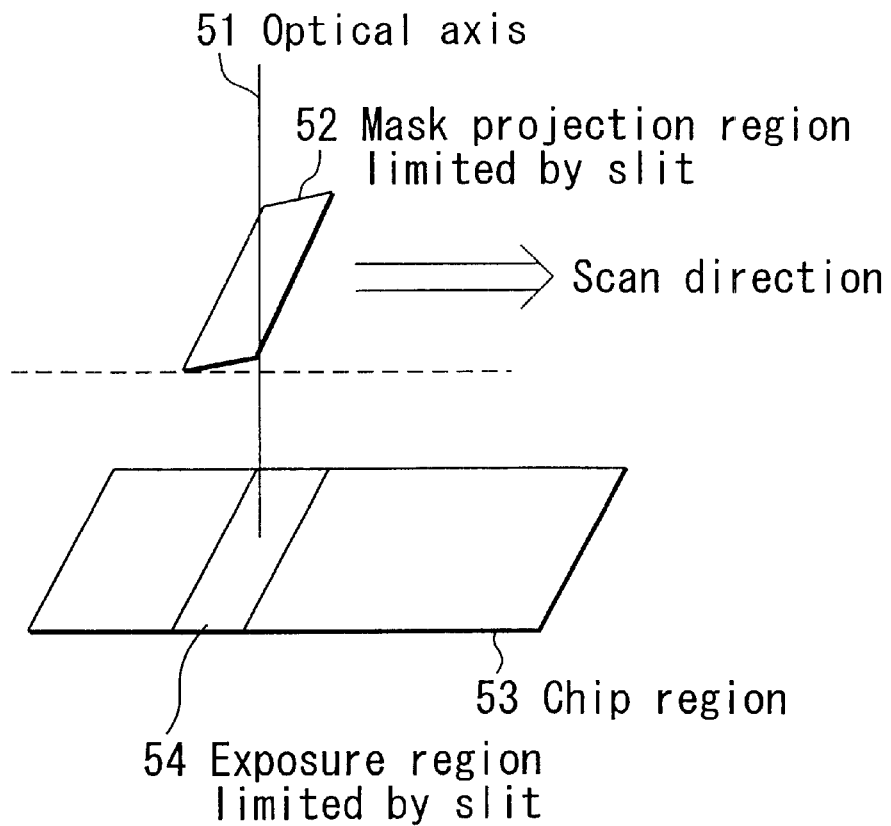
FIG. 6A is directed to a third embodiment of the present invention, and shows that a scanning exposure is carried out with the mask tilted relative to the wafer within the slit.
Figure 6B:
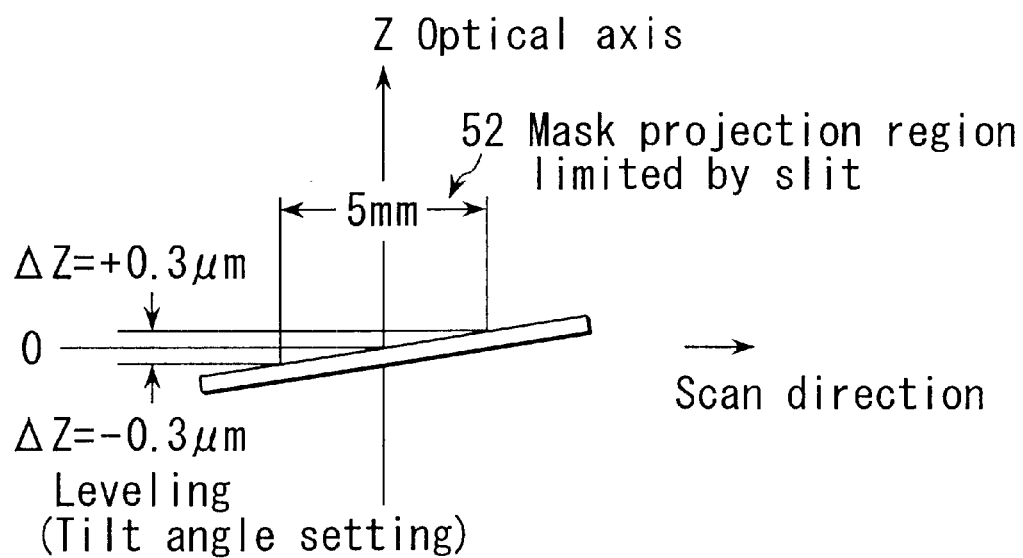
FIG. 6B is also directed to the third embodiment of the present invention, and shows how to define the leveling under the state that the mask is tilted relative to the wafer within the slit.

A third embodiment of the present invention will now be described with reference to FIGS. 6A, 6B and 7. In the third embodiment, the first scanning exposure and the second scanning exposure are made different from each other in the leveling (tilt angle) between the wafer and the mask and are made opposite to each other in the scanning direction.

To be more specific, the scanning exposure was carried out with the mask 11 held tilted relative to the wafer 14 within the slit 15 restricting the exposure region, as shown in FIG. 3B. FIG. 6A shows the situation. A reference numeral 51 shown in FIG. 6A denotes an optical axis, a reference numeral 52 denotes a mask projection region restricting the exposure region, a reference numeral 53 denotes a chip region, and a reference region 54 denotes an exposure region limited by a slit.

The mask pattern used in the third embodiment was equal to that used in the first embodiment. To reiterate, an open pattern having a width of 0.2 $\mu$m was formed on a positive tone resist. In the first exposure, the tilting angle of the mask fell within a range of ±0.3 $\mu$m in the scanning direction, and the coherency factor was 0.75. Then, the second exposure was carried out by reversing the scanning direction. In the second exposure, the coherency factor was set at 0.3, and the exposure dose under the state that the wafer and the mask were not tilted each other was set at a value 5% smaller than that in the first exposure.

The tilting amount of the mask will now be described with reference to FIG. 6B. In the third embodiment, the width of the mask projecting region within the slit region is set at 5 mm. In this case, the difference $\Delta z$ (=±0.3 $\mu$m) between the z-coordinate at the intersection with the optical axis in the center of the mask projecting region and the z-coordinate on the optical axis at the edge in the scanning direction of the mask projecting region is called the tilting amount of the mask.

The reason for the change in the exposure dose between the first and second scanning exposures is as follows.

Figures 7, 8:
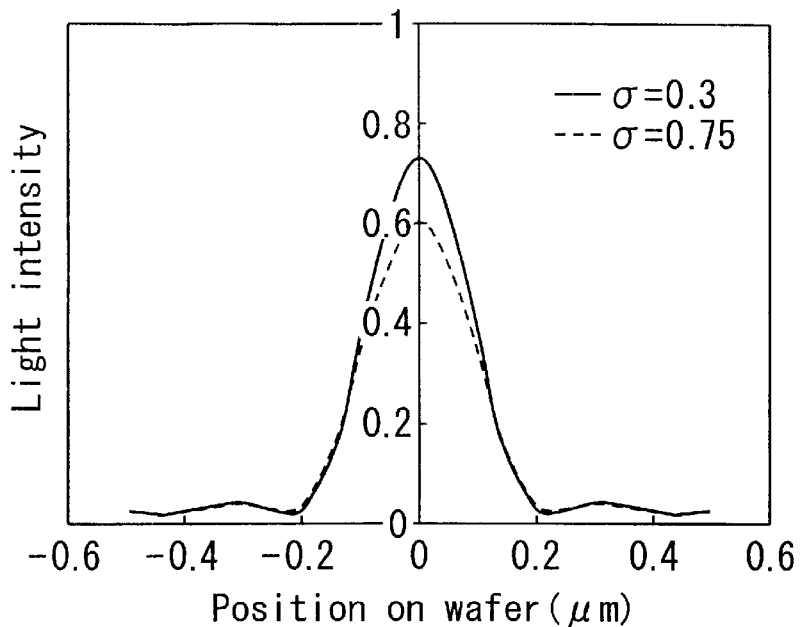
FIG. 7 is a graph intended to show the difference in the light intensity distribution caused by the difference in the coherency factor.
FIG. 8 is a table showing the scope of change in the exposure conditions that is possible in the multiple exposure of the present invention.

FIG. 7 is a graph obtained by the optical simulation of the light intensity distribution of the 0.2 $\mu$m pattern. As shown in the graph of FIG. 7, the light intensity is changed with the change in the coherency factor $\sigma$. Where the coherency factor $\sigma$ is 0.75, the light intensity is low, compared with the case where the coherency factor $\sigma$ is 0.3. Under the circumstances, the exposure dose was controlled such that the first and second scanning exposures would be substantially the same in the light intensity. In this fashion, a good pattern was formed by the multiple exposure method.

The present invention is not limited to the first and second embodiments described above. Specifically, the order of the first exposure and the second exposure is not particularly limited. Also, it is possible to change the tilting amount in the scanning step, the coherency factor, etc. in accordance with the required pattern. In addition, the first and second exposures of the entire mask differ from each other in the exposure conditions. These exposure conditions are not limited to those referred to in each of the embodiments described previously and include, for example, the focusing point, the exposure dose, the coherency factor of the illumination optical system, and the numerical aperture of the optical projection system.

FIG. 8 is a table showing the kind and the amount of change of the exposure conditions which produced good results and the scope in the amount of the possible change in the multiple exposure of the present invention. (a) and (b) in FIG. 8 correspond to the second and third embodiments, respectively, of the present invention. On the other hand, (c), (d) and (e) in FIG. 8 represent the data obtained from the similar actual measurements. The actual measurement was performed with the numerical aperture of the optical projection system set at 0.6 in all of the cases.

The scope in the amount of possible change of the focus and the leveling, which are most important in the present invention, was ±0.3 $\mu$m, the scope of possible change of the exposure dose was 0.5 to 1 in terms of the relative value, the scope in the possible change of the coherency factor was 0.3 to 0.75. Needless to say, in the multiple exposure of the present invention, the exposure conditions can be optimized to obtain the best resolution by changing the numerical aperture of the optical projection system from 0.6.

The present invention is not necessarily limited to the case where the multiple exposure is performed twice. It is possible to apply the technical idea of the present invention to the case where the multiple exposure is performed three times or more. Further, the present invention can be worked in variously modified fashions within the technical scope of the present invention.

As described above in detail, according to the present invention, the multiple exposure can be performed by changing the exposure conditions in the step-and-scan type exposure method. It is also possible to control the coherency factor of the illumination system and the exposure dose for every focusing point, which is required for the optimization of the multiple exposure, thereby contributing to an improvement in the pattern transfer accuracy. What should also be noted is that the time required for exposing an entire exposure region can be shortened by making the first and second scanning exposures opposite to each other in the scanning direction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A scanning exposure method, in which, when a pattern formed on a mask is transferred onto a target substrate via an optical projection system, the projecting region of the mask is limited by a slit, and the slit is scanned relative to the mask and the target of the mask onto the substrate, wherein the exposure of the mask by the relative scanning of the slit is carried out by changing the exposure conditions, the exposure conditions including a focusing point of the optical projection system, and first and second exposures of the mask are carried out by changing the focusing point of the optical projection system.

2. The scanning exposure method according to claim 1, wherein the slit is scanned relative to the mask and the target of the mask so as to transfer the entire pattern region of the mask onto the substrate.

3. The scanning exposure method according to claim 1, wherein the scope of change in the focusing point of said optical projection system falls within a range of between −0.3 $\mu$m and +0.3 $\mu$m.

4. The scanning exposure method according to claim 1, wherein at least one of the exposures of the entire mask is carried out with the mask and the substrate tilted relative to each other within the projection region restricted by the slit.

5. The scanning exposure method according to claim 1, wherein the scope of the relative tilting of said mask and said substrate falls within a range of between −0.3 $\mu$m and +0.3 $\mu$m.

6. The scanning exposure method according to claim 1, wherein the first and second exposures of the entire mask is carried out by making the relative scanning directions of the slit opposite to each other.

7. The scanning exposure method according to claim 6, wherein at least two adjacent regions are consecutively scanned in the same direction for the exposure relative to a target substrate to which a pattern of the mask is transferred in a plurality of regions, followed by scanning these two adjacent regions in the opposite direction so as to carry out a multiple exposure.

8. The scanning exposure method according to claim 1, wherein the first and second exposures of the entire mask are different from each other in the exposure dose.

9. The scanning exposure method according to claim 8, wherein the scope of relative values of the mutually different exposure doses of said optical projection system falls within a range of between 0.5 and 1.

10. The scanning exposure method according to claim 1, wherein the first and second exposures of the entire mask are different from each other in the coherency factor of the optical illumination system.

11. The scanning exposure method according to claim 10, wherein the scope of relative values of the mutually different coherency factor of said optical projection system falls within a range of between 0.3 and 0.75.

12. The scanning exposure method according to claim 1, wherein the first and second exposures of the entire mask are different from each other in a numerical aperture of the optical projection system.

13. A scanning exposure method, in which, when a pattern formed on a mask is transferred onto a target substrate via an optical projection system, the projecting region of the mask is limited by a slit, and the slit is scanned relative to the mask and the target substrate so as to transfer the entire pattern region of the mask onto the substrate, wherein the exposure of the entire mask by the relative scanning of the slit is carried out at least twice by changing the exposure conditions so as to achieve a multiple exposure of the pattern image on the substrate in a superposed fashion;

the focusing points in the multiple exposure are set in at least two ways; and at least one multiple exposure is carried out under the condition that the mask and the substrate are relatively tilted within the projecting region restricted by said slit.

14. The scanning exposure method according to claim 13, wherein the set scope of said focusing point falls within a range of between −0.3 $\mu$m and +0.3 $\mu$m.

15. The scanning exposure method according to claim 13, wherein the relatively tilted scope between said mask and said substrate falls within a range of between −0.3 $\mu$m and +0.3 $\mu$m.

16. The scanning exposure method according to claim 13, wherein the first and second exposures of the entire mask are made opposite to each other in the relative scanning direction of said slit.

17. The scanning exposure method according to claim 13, wherein at least two adjacent regions are consecutively scanned in the same direction for the exposure relative to a target substrate to which a pattern of the mask is transferred in a plurality of regions, followed by scanning these two adjacent regions in the opposite direction so as to carry out a multiple exposure.

* * * * *